(12) United States Patent
Chiu et al.

(10) Patent No.: US 9,722,142 B2
(45) Date of Patent: Aug. 1, 2017

(54) LIGHT EMITTING DIODE DIE AND MANUFACTURING METHOD THEREOF

(71) Applicant: ADVANCED OPTOELECTRONIC TECHNOLOGY, INC., Hsinchu Hsein (TW)

(72) Inventors: Ching-Hsueh Chiu, Hsinchu (TW); Ya-Wen Lin, Hsinchu (TW); Po-Min Tu, Hsinchu (TW); Shih-Cheng Huang, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/853,175

(22) Filed: Sep. 14, 2015

(65) Prior Publication Data

US 2016/0087151 A1 Mar. 24, 2016

(30) Foreign Application Priority Data

Sep. 19, 2014 (CN) .......................... 2014 1 0480585

(51) Int. Cl.
*H01L 29/06* (2006.01)
*H01L 33/24* (2010.01)
*H01L 33/38* (2010.01)
*H01L 33/00* (2010.01)

(52) U.S. Cl.
CPC ............ *H01L 33/24* (2013.01); *H01L 33/385* (2013.01); *H01L 33/007* (2013.01)

(58) Field of Classification Search
None
See application file for complete search history.

(56) References Cited

U.S. PATENT DOCUMENTS

2002/0117677 A1* 8/2002 Okuyama ......... H01L 21/02381
257/94
2011/0175055 A1* 7/2011 Pan ......................... H01L 33/24
257/13

* cited by examiner

*Primary Examiner* — Shaun Campbell
(74) *Attorney, Agent, or Firm* — Steven Reiss

(57) ABSTRACT

An LED die includes a substrate, a pre-growth layer, a first insulating layer and a light emitting structure. The pre-growth layer, the first insulating layer and the light emitting structure are formed on the structure that order. The substrate includes a first electrode, a second electrode and an insulating part. The insulating part is formed between the first electrode and the second electrode. The LED die further includes a second insulating layer and a metal layer which are formed around the pre-growth layer. The present disclosure includes a method for manufacturing the LED die.

6 Claims, 8 Drawing Sheets

LIGHT EMITTING DIODE DIE AND MANUFACTURING METHOD THEREOF

FIELD

The subject matter relates to a light emitting diode (LED) die and manufacturing method thereof.

BACKGROUND

A traditional LED die is formed by growing a non-polar semiconductor on a sapphire substrate. A p-type electrode and an n-type electrode are formed on top of the semiconductor, respectively. When the LED die works, current will flow through a shortest path which is a top end of the semiconductor having the most defect density.

BRIEF DESCRIPTION OF THE DRAWINGS

Implementations of the present technology will now be described, by way of example only, with reference to the attached figures.

DETAILED DESCRIPTION

Figure 1:
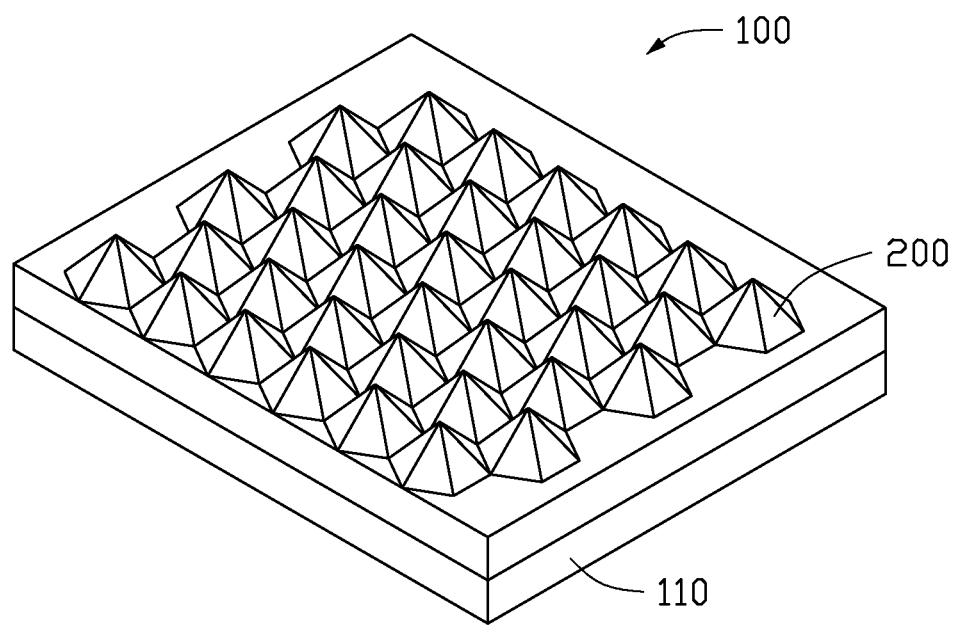
FIG. 1 is an assembly schematic view of an LED die in accordance with an exemplary embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Referring to FIG. 1, an LED die 100 of the present disclosure includes a plurality of grains 200 formed on a base 110. The grains 200 abut against each other. Each grain 200 is shaped as a six-sided pyramid. The grains 200 are arranged such that each inner grain 200 contacts with and is surrounded by six adjacent grains 200 and the peripheral grains 200 surround the inner grains 200. Two adjacent peripheral grains 200 contact each other side by side.

Figure 2:
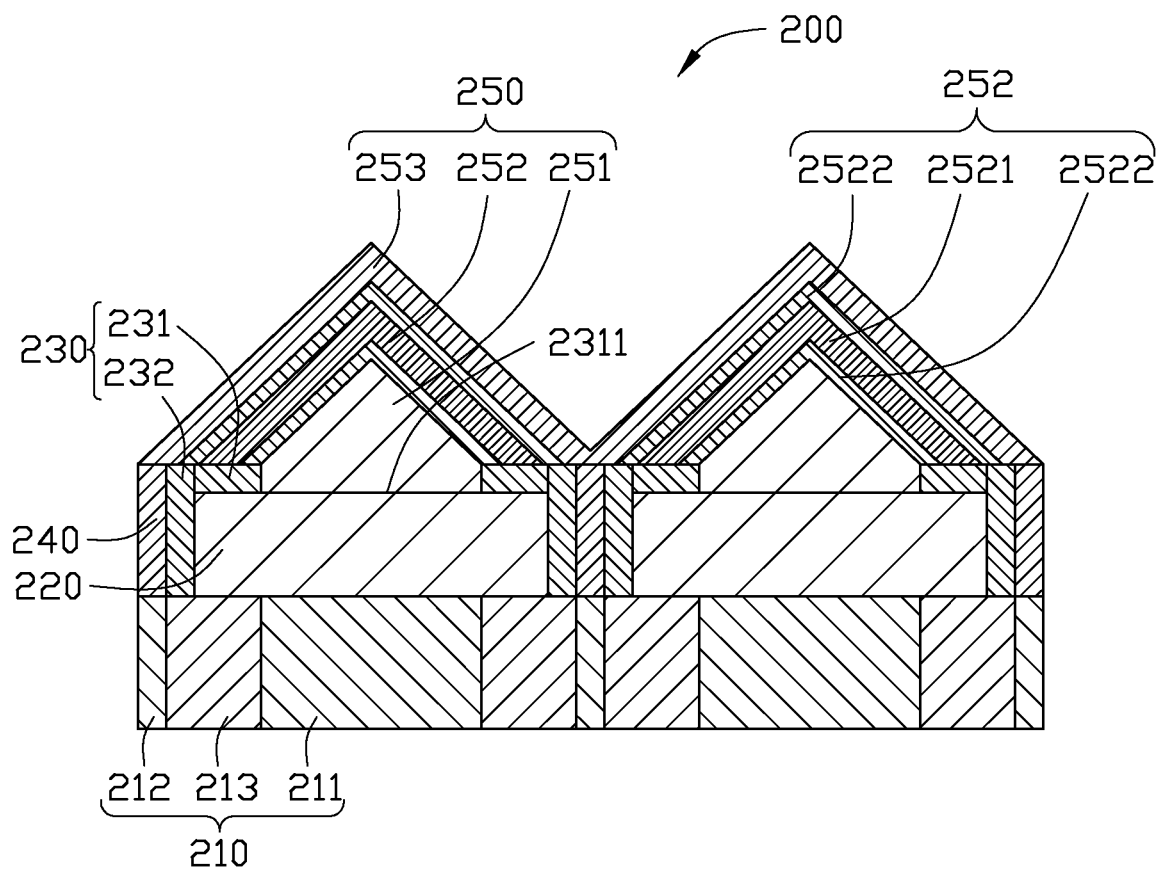
FIG. 2 is a longitudinal cross-section view along the central axis of two adjacent grains in FIG. 1.

Referring to FIG. 2, each grain 200 includes a pre-growth layer 220 and a light emitting structure 250 formed on a substrate 210. Each grain 200 further includes a metal layer 240 and an insulating layer 230. The metal layer 240 surrounds the pre-growth layer 220 and is separated from the pre-growth layer 220 by the insulating layer 230.

Figure 3:
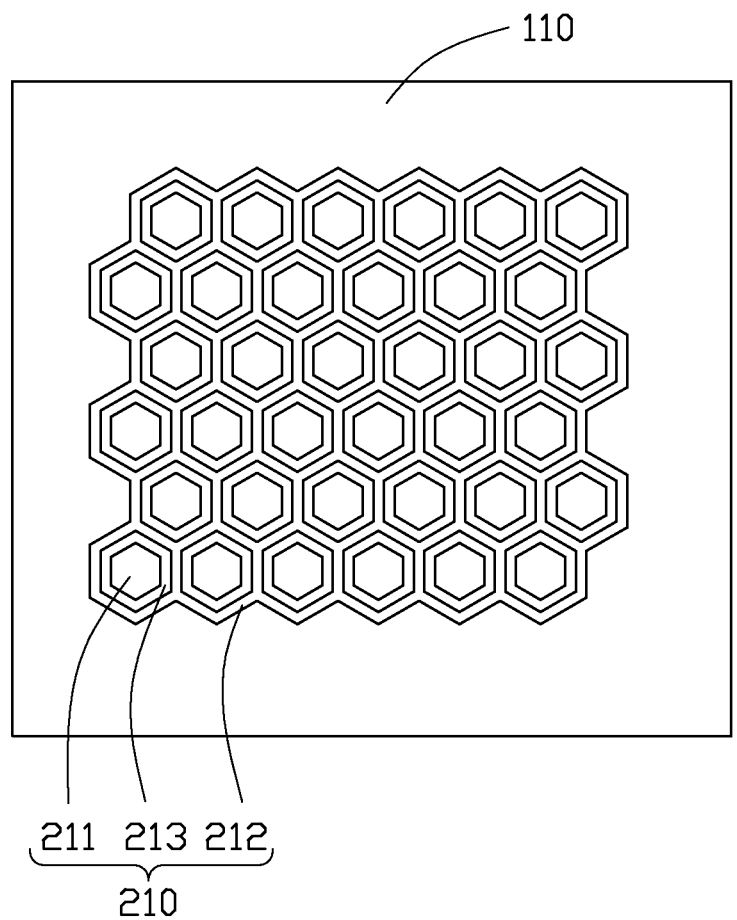
FIG. 3 is a top view of a base of the LED die in FIG. 1.

Referring to FIG. 2 and FIG. 3, the base 10 is flat. The base 10 includes a plurality of the substrates 210. The substrates 210 contact with each other to together form the base 110. The substrates 210 are arranged such that each inner substrate 210 contacts with and is surrounded by six adjacent substrates 210 and the peripheral substrates 210 surround the inner substrates 210. Each substrate 210 includes a first electrode 211, a second electrode 212 and an insulating part 213. The first electrode 211 is surrounded by the second electrode 212. The insulating part 213 is formed between the first electrode 211 and the second electrode 212. The second electrode 212 between two adjacent substrates 210 is shared by the two corresponding substrate 210.

The first electrode 211 is N-type. The first electrode 211 is formed in center of the substrate 210. The first electrode 211 is a six-sided prism. A transverse cross-section of the first electrode 211 is a regular hexagon and a longitudinal cross-section of the first electrode 211 is a rectangle.

The insulating part 213 is made of materials with high resistance property, such as resin, AlN and so on. In this exemplary embodiment, the insulating part 213 is made of resin to prevent from electronic connection between the first electrode 211 and the second electrode 212.

The insulating part 213 is a hollow six-sided prism. A transverse cross-section of the insulating part 213 is a hexagonal ring. A longitudinal cross-section of the insulating part 213 is two rectangles located beside two sides of the first electrode 211 respectively. The insulating part 213 surrounds periphery of the first electrode 211. A height of the insulating part 213 is equal to a height of the first electrode 211.

The second electrode 212 is P-type. The second electrode 212 is a hollow six-sided prism. A transverse cross-section of the second electrode 212 is a hexagonal ring. A longitudinal cross-section of the second electrode 212 is two rectangles located beside two sides of the insulating part 213 respectively. The second electrode 212 surrounds periphery of the insulating part 213. A height of the second electrode 212 is equal to a height of the insulating part 213.

Referring to FIG. 2, the pre-growth layer 220 of the grain 200 is an N-type semiconductor. In this exemplary embodiment, the pre-growth layer 220 is made of GaN. The pre-growth layer 220 is a six-sided prism. A transverse cross-section of the pre-growth layer 220 is a regular hexagon. A longitudinal cross-section of the pre-growth layer 220 is a rectangle.

The pre-growth layer 220 is formed on center of the substrate 210. A width of the pre-growth layer 220 ranges from a width of an inner ring of the insulating part 213 to a width of an outer ring of the insulating part 213 in a transverse cross-section. In other words, the pre-growth layer 220 is formed on the first electrode 211 and the insulating part 213. The pre-growth layer 220 covers the first electrode 211 and part of the insulating part 213. The pre-growth layer 220 connects to the first electrode 211 of the substrate 210 electrically and directly.

The insulating layer 230 of the grain 200 is made of insulating materials. In this exemplary embodiment, the insulating layer 230 is made of $SiO_2$. The insulating layer 230 includes a first insulating layer 231 and a second insulating layer 232. The first insulating layer 231 and the second insulating layer 232 are perpendicular to each other. The first insulating layer 231 is horizontal and the second insulating layer 232 is vertical.

The first insulating layer 231 is a hollow six-sided prism. The first insulating layer 231 is formed on the periphery edge of a top surface of the pre-growth layer 220. The first insulating layer 231 extends upwards from the top surface of the pre-growth layer 220. A thickness of the first insulating layer 231 remains all the same. An outer ring of the first insulating layer 231 is a regular hexagon and an inner ring of the first insulating layer 231 is a circle in a transverse cross-section. A width of the outer ring of the first insulating layer 231 is equal to a width of the pre-growth layer 220 in a transverse cross-section. The inner ring of the first insulating layer 231 defines a circular opening 2311. The opening 2311 exposes part of the pre-growth layer 220.

The second insulating layer 232 is a hollow six-sided prism. The second insulating layer 232 surrounds the pre-growth layer 220 and the first insulating layer 231. A top inner surface of the second insulating layer 232 contacts with periphery of the first insulating layer 231. A height of the second insulating layer 232 is equal to a sum height of the pre-growth layer 220 and the first insulating layer 231. A transverse cross-section of the second insulating layer 232 is a regular hexagonal ring. A longitudinal cross-section of the second insulating layer 232 is two rectangles located beside two sides of the pre-growth layer 220 and first insulating layer 231 respectively.

The second insulating layer 232 is formed on the insulating part 213 of the substrate 210. The second insulating layer 232 and the pre-growth layer 220 together cover the first electrode 211 and the insulating part 213 of the substrate 210. In other words, a width of an outer ring of the second insulating layer 232 is equal to a width of an outer ring of the insulating part 213 of the substrate 210 in a transverse cross-section.

The metal layer 240 of the grain 200 can be made of metals, such as Ti, Al, Pt, Au and so on. In this exemplary embodiment, the metal layer 240 is made of Ti. The metal layer 240 is a hollow six-sided prism. The metal layer 240 surrounds periphery of the second insulating layer 232. A transverse cross-section of the metal layer 240 is a regular hexagonal ring. A longitudinal cross-section of the metal layer 240 is two rectangles located beside two sides of the second insulating layer 232 respectively. A height of the metal layer 240 is equal to a height of the second insulating layer 232. The metal layer 240 is insulated from the pre-growth layer 220 by the second insulating layer 232. The metal layer 240 between two adjacent substrates 210 is shared by two corresponding grains 200.

The metal layer 240 is formed on the second electrode 212 of the substrate 210.

The metal layer 240 covers the second electrode 212 of the substrate 210. In other words, a width of the metal layer 240 is equal to a width of the second electrode 212 of the substrate 210 in a transverse cross-section. The metal layer 240 connects to the second electrode 212 of the substrate 210 electrically and directly.

The light emitting structure 250 of the grain 200 is a six-sided pyramid structure.

The light emitting structure 250 is formed on the pre-growth layer 220 and from the opening 2311. The light emitting structure 250 includes a first semiconductor layer 251, an active layer 252 and a second semiconductor layer 253 formed on the pre-growth layer 220 that order. The light emitting structure 250 covers the pre-growth layer 220, the insulating layer 230 and the metal layer 240. A bottom surface of the active layer 252 and a bottom surface of the second semiconductor layer 253 are coplanar and attached on the insulating layer 230 and the metal layer 240.

The first semiconductor layer 251 is an N-type semiconductor. The first semiconductor layer 251 can be made of material the same with the pre-growth layer 220. In this embodiment, the first semiconductor layer 251 is made of GaN. The first semiconductor layer 251 grows on the opening 2311 and further grows upwards to form a six-sided pyramid. A transverse cross-section of the first semiconductor layer 251 is a regular hexagon. A longitudinal cross-section of the first semiconductor layer 251 is an isosceles triangle. A width of the first semiconductor layer 251 is equal to a width of the first electrode 211 of the substrate 210 in a transverse cross-section. The first semiconductor layer 251 is electrically connected to the first electrode 211 of the substrate 210 via the pre-growth layer 220.

The active layer 252 grows on the first semiconductor layer 251. A longitudinal cross-section of the active layer 252 is a reversed V shape. A bottom surface of the active layer 252 is attached on the insulating layer 230. A width of the active layer 252 ranges from a width of an inner ring of the second insulating layer 232 to a width of an outer ring of the second insulating layer 232 in a transverse cross-section. In this exemplary embodiment, the active layer 252 covers the first semiconductor layer 251, the first insulating layer 231 and part of the second insulating layer 232.

The active layer 252 includes two quantum energy barriers 2522 and a quantum well 2521 sandwiched between the two quantum energy barriers 2522. Specifically, bottom surfaces of the quantum well 2521 and one of the quantum energy barriers 2522 are attached on the first insulating layer 231. Thus, the active layer 252 is insulated from the pre-growth layer 220 via the first insulating layer 231. Bottom surface of the other quantum energy barrier 2522 is attached on the second insulating layer 232. Thus, the active layer 252 is insulated from the metal layer 240 via the second insulating layer 232.

The second semiconductor layer 253 is a P-type semiconductor. In this exemplary embodiment, the second semiconductor layer 253 is made of GaN. The second semiconductor layer 253 is formed on the active layer 252. A longitudinal cross-section of the second semiconductor layer 253 is a reversed V shape. A bottom surface of the second semiconductor layer 253 is attached on the metal layer 240, thereby electrically connecting with the second electrode 212 via the metal layer 240. A width of an outer ring of the second semiconductor layer 253 is equal to a width of an outer ring of the metal layer 240 in a transverse cross-section. A width of an inner ring of the second semiconductor layer 253 ranges from a width of an inner ring of the second insulating layer 232 to a width of an outer ring of the second insulating layer 232 in a transverse cross-section. In this exemplary embodiment, the second semiconductor layer 253 covers the active layer 252, the metal layer 240 and part of the second insulating layer 232. The second semiconductor layer 253 between two adjacent substrates 210 is shared by two corresponding grains 200.

Compared to the traditional LED grain, the LED die 100 in the present disclosure includes a plurality of grains 200. The first electrode 211 and the second electrode 212 of the grain 200 are not only formed on the substrate 210, but also under the first semiconductor layer 251 and the second semiconductor layer 253. When the LED die 100 works, a current loop is formed to flow from the second electrode 212, the metal layer 240, the second semiconductor layer 253, top of the pyramid structure of the light emitting structure 250 and then back to the second semiconductor layer 253, the first semiconductor 251, the pre-growth layer 220 and first electrode 211 that order. In this process, current does not flows from the top of the pyramid of the light emitting structure 250 where having the most defect density, thereby avoiding a case of leakage. Additionally, because the current can flow though the whole light emitting structure 250, a light extraction area of the grain 200 is widened, thereby widening the light extraction area of the LED die 100.

A method for manufacturing the LED die 100 is also provided in the present disclosure.

Figure 4:
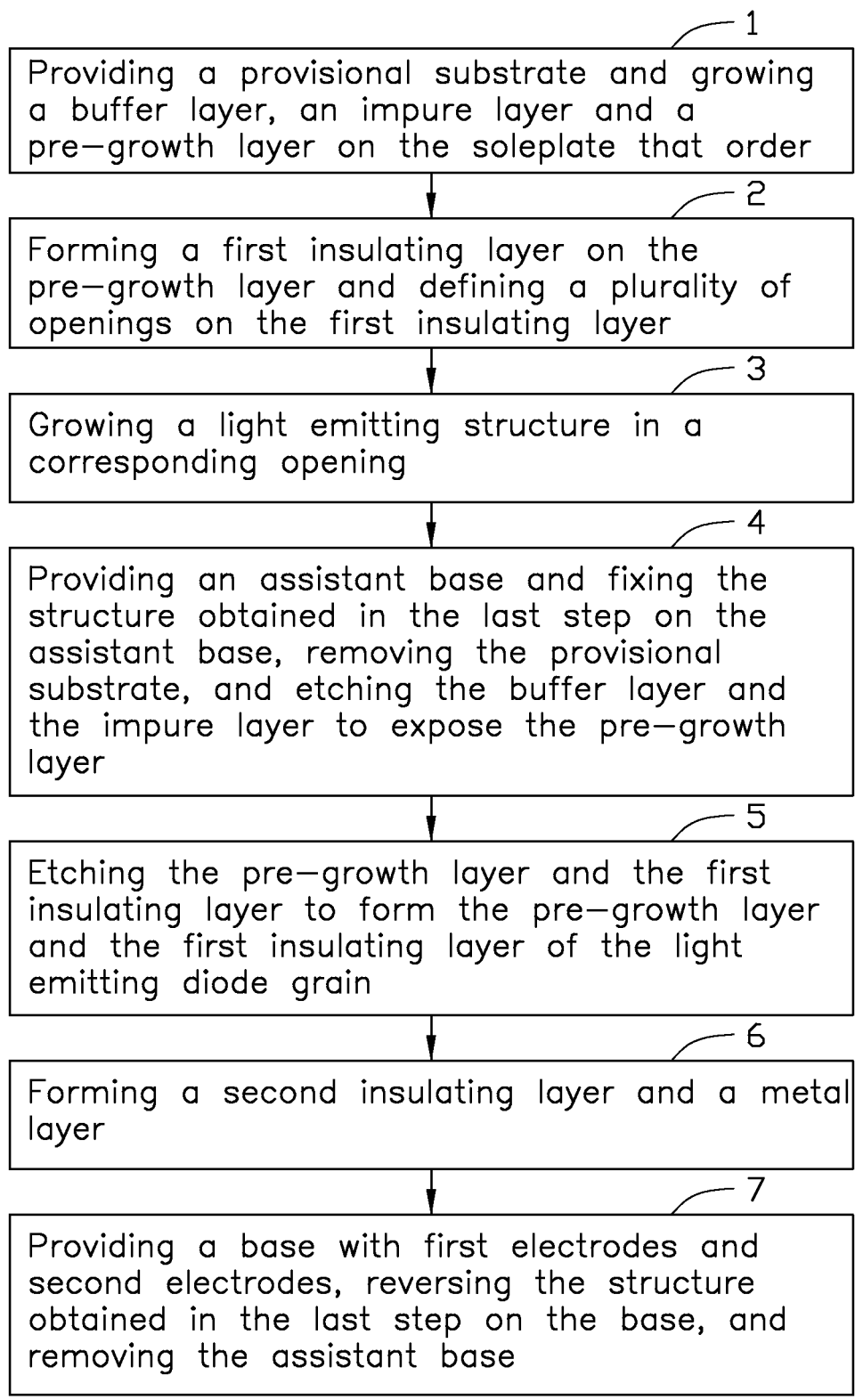
FIG. 4 is a flow chart of a method for manufacturing the LED die in FIG. 1.

Referring to FIG. 4, the method for manufacturing the LED die 100 includes:

providing a provisional substrate 310 and growing a buffer layer 320, an impure layer 330 and a pre-growth layer 340 on the provisional substrate 310 that order;

forming a first insulating layer 350 on the pre-growth layer 340 and defining a plurality of openings 2311 on the first insulating layer 350;

growing a light emitting structure 250 in a corresponding opening 2311; each light emitting structure 250 including a first semiconductor layer 251, an active layer 252 and a second semiconductor layer 253 growing on the pre-growth layer 340 that order;

providing an assistant base 380 and fixing the structure obtained in the last step on the assistant base 380, removing the provisional substrate 310, and etching the buffer layer 320 and the impure layer 330 to expose the pre-growth layer 340;

etching the pre-growth layer 340 and the first insulating layer 350 to form the pre-growth layer 220 and the first insulating layer 231 of the LED die 100;

forming a second insulating layer 232 to surround the pre-growth layer 220 and a metal layer 240 to surround the second insulating layer 232;

providing a base 110 with first electrodes 211 and second electrodes 213, reversing the structure obtained in the last step on the base 210, and removing the assistant base 380.

Figure 5:
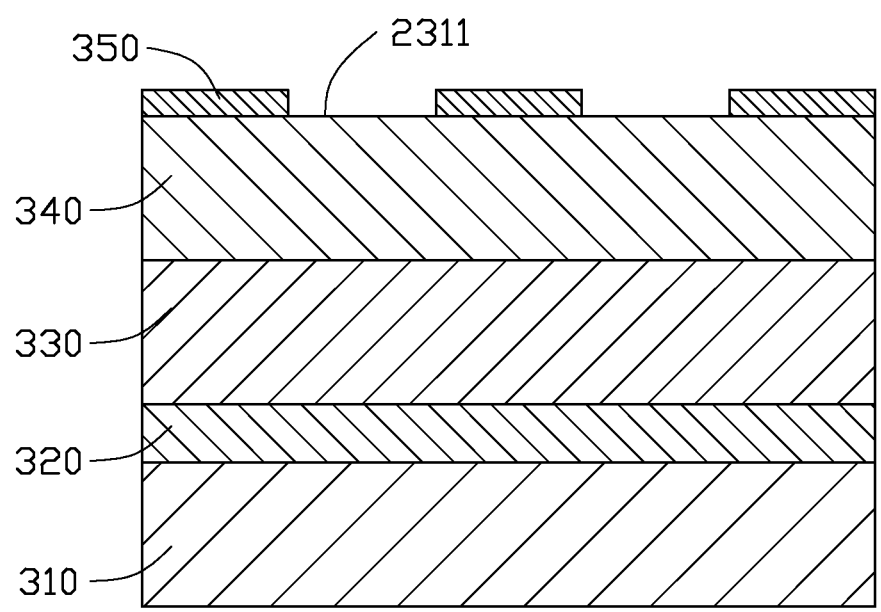
FIG. 5 to FIG. 8 are longitudinal cross-sectional views showing semi-finished LED die processed by different steps of a method for manufacturing the LED die in FIG. 1.

Referring to FIG. 5, the provisional substrate 310 is provided. In this exemplary embodiment, the provisional substrate 310 can be a sapphire. The buffer layer 320 grows on the provisional substrate 310. The buffer layer 20 is a cryo-semiconductor. The buffer layer 20 is GaN. The buffer layer 320 covers the provisional substrate 310 completely. The impure layer 330 grows on the buffer layer 320. The impure layer 330 is GaN. The impure layer 330 covers the buffer layer 320 completely. The pre-growth layer 340 grows on the impure layer 330. The pre-growth layer 340 is an N-type semiconductor. The pre-growth layer 340 is made of GaN. The pre-growth layer 340 covers the impure layer 330 completely.

The first insulating layer 350 is formed on the pre-growth layer 340. A plurality of openings 2311 are defined on the first insulating layer 350. The first insulating layer 350 is made of $SiO_2$. In this exemplary embodiment, each opening 2311 is circular. The openings 2311 are defined such that each inner opening 2311 is surrounded by six adjacent openings 2311 and the peripheral openings 2311 surround the inner openings 2311. The two adjacent openings 2311 are separated apart from each other. A diameter of the opening 2311 ranges from 2 μm to 5 μm. In this exemplary embodiment, a diameter of the opening 2311 is about 3 μm. A distance between two adjacent openings 2311 ranges from 0.5 μm to 1.5 μm. In this exemplary embodiment, a distance between two adjacent openings 2311 is about 1 μm.

In this exemplary embodiment, obtaining a structure showed in the FIG. 5 includes:

Forming a plurality of circular photoresists (not shown in FIGs) on the pre-growth layer 340 where the opening 2311 defined; forming a $SiO_2$ layer on the circular photoresists, the $SiO_2$ layer covering the circular photoresists and the pre-growth layer 340; removing the circular photoresists and part of the $SiO_2$ layer which covering the circular photoresists. Then the first insulating layer 350 is formed by the residual part of the $SiO_2$ layer and the opening 2311 are defined on the areas where the circular photoresists located.

Figure 6:
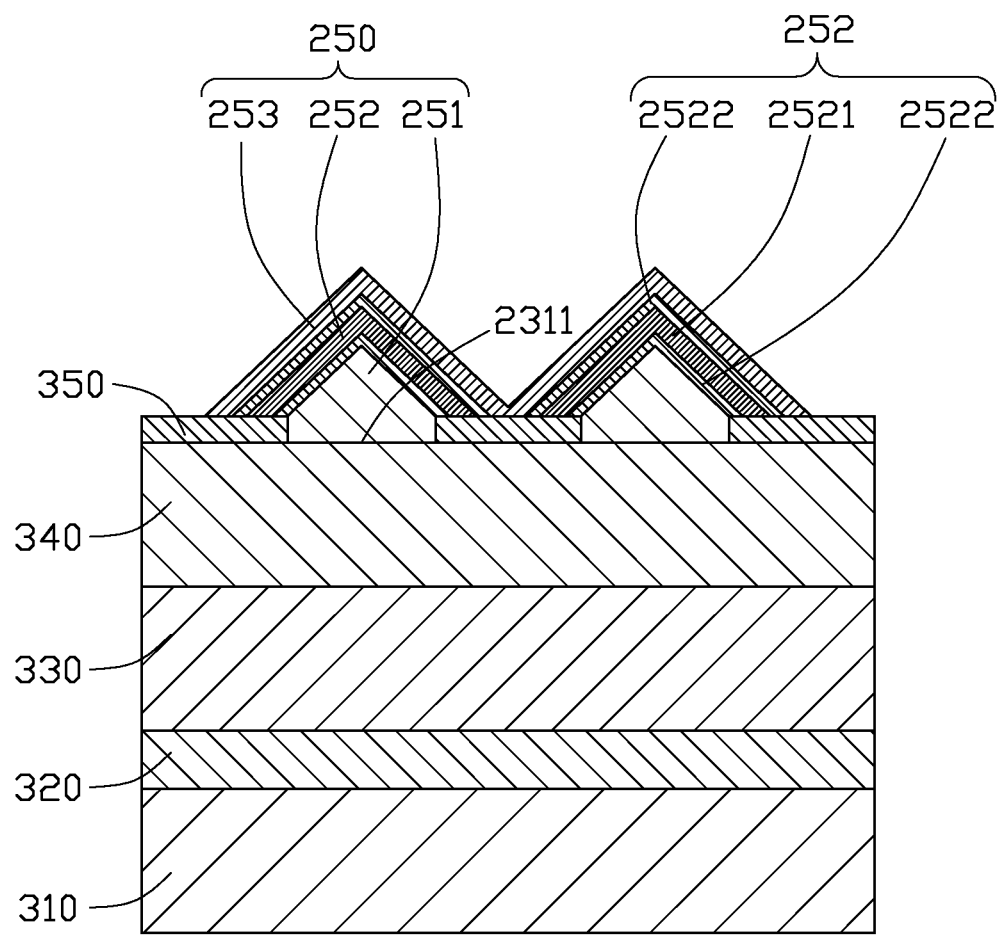

Referring to FIG. 6, each light emitting structure 250 is formed on a corresponding opening 2311. The first semiconductor layer 251 of the light emitting structure 250 grows in the opening 2311. The first semiconductor layer 251 grows from the bottom of the opening 2311 upwards. The first semiconductor layer 251 is a six-sided pyramid. The six-sided pyramid structure of the first semiconductor layer 251 is formed by controlling growth condition that a grown speed of the first semiconductor layer 251 in a vertical direction is greater than a grown speed of the first semiconductor layer 251 in a horizontal direction. So the bottom of the first semiconductor layer 251 can fill the opening 2311 and the first semiconductor layer 251 can further grow until forming the six-sided pyramid structure. The active layer 252 and the second semiconductor layer 253 of the light emitting structure 250 grows on the first semiconductor layer 251 that order. The active layer 252 and the second semiconductor layer 253 are also six-sided pyramid shaped. The active layer 252 covers the first semiconductor layer 251 completely and covers part of the first insulating layer 350. The second semiconductor layer 253 covers the active layer 252 completely and covers part of the first insulating layer 350. A bottom surface of the active layer 252 and a bottom surface of the second semiconductor layer 253 are coplanar and are attached on the insulating layer 230.

Figure 7:
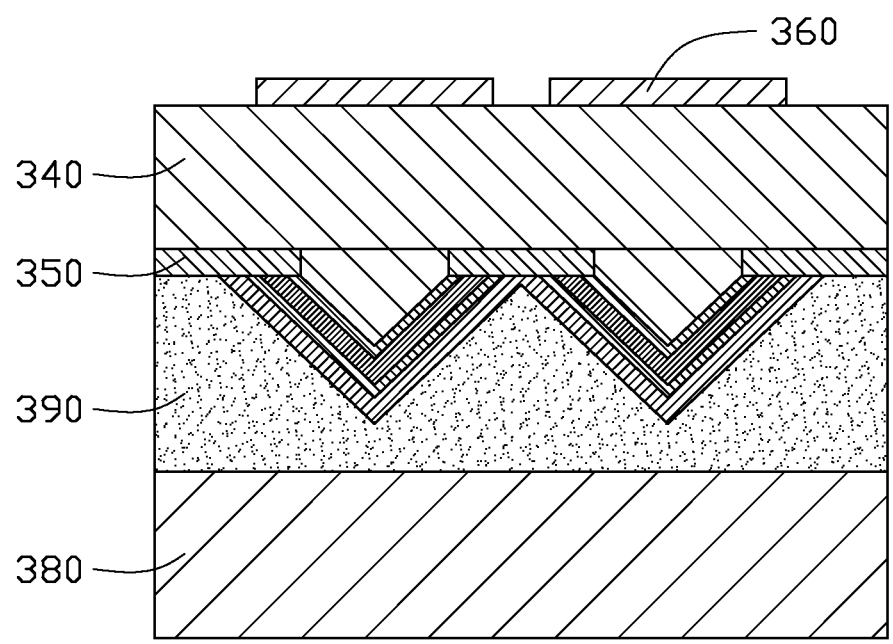

Referring to FIG. 7, the assistant base 380 is provided. The assistant base 380 can be made of Si, Cu or CuW and so on. In this exemplary embodiment, the assistant base 380 is made of Si. The structure shown in FIG. 6 is reversed and fixed on the assistant base 380 with colloid 390. The provisional substrate 310 is removed via laser lift-off. The buffer layer 320 and the impure layer 330 are etched to expose the pre-growth layer 340 by lithography etching technology.

Figure 8:
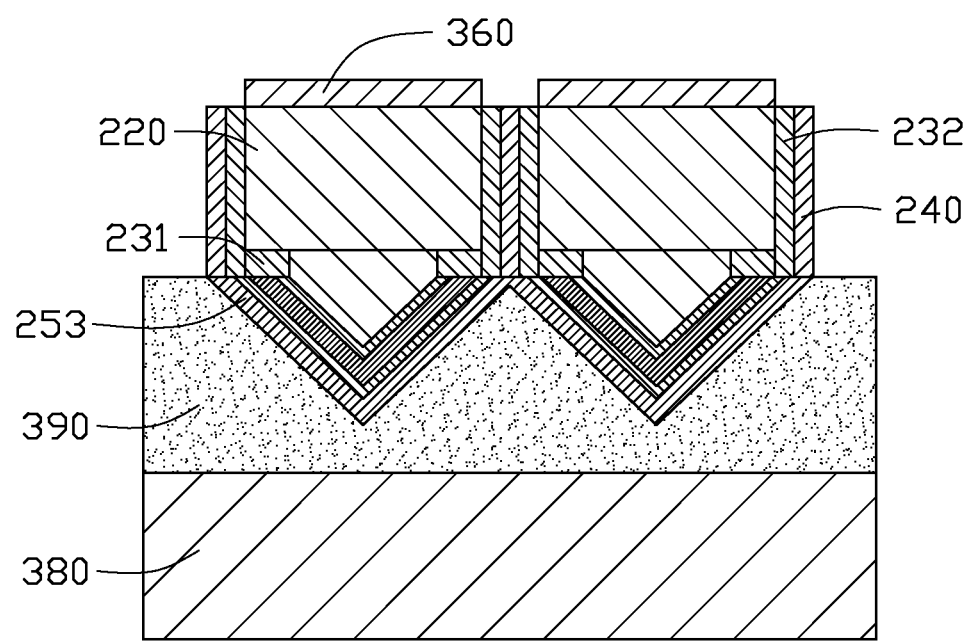

In this exemplary embodiment, etching the pre-growth layer 340 and the first insulating layer 350 to form the pre-growth layer 220 and the first insulating layer 231 of the LED die 100 includes:

Forming a plurality of photoresists 360 on the pre-growth layer 340; etching part of the pre-growth layer 340 and part of the first insulating layer 350 uncovered by the photoresists 360 in a vertical direction. Then the pre-growth layer 220 of the LED die 100 is formed by the residual part of the pre-growth layer 340 and the first insulating layer 231 is formed by the residual part of the first insulating layer 350, as shown in FIG. 8.

Preferably, each photoresist 360 is a regular hexagon. The photoresists 360 are arranged such that each inner photoresist 360 is surrounded by six adjacent photoresists 360 and the peripheral photoresists 360 surround the inner photoresists 360. The two adjacent photoresists 360 are separated apart from each other. A width of the photoresist 360 ranges from a width of an inner ring of the active layer 252 to a width of an outer ring of the active layer 252.

In this exemplary embodiment, forming the second insulating layer 232 and the metal layer 240 includes:

Forming photoresists (not shown in FIGs) on the second semiconductor layers 253 of the light emitting structures 250, the photoresists being around the pre-growth layer 220 and the first insulating layer 231 and coving bottom surface of the second semiconductor layers 253 completely, a height of the photoresists being equal to a sum height of the pre-growth layer 220 and the first insulating layer 231;

filling channels between the photoresists and the pre-growth layer 220 with SiO$_2$ to form the second insulating layer 232, a height of the second insulating layer 232 being equal to a sum height of the pre-growth layer 220 and the first insulating layer 231; removing the photoresists and forming the metal layer 240 to replace the photoresists, the metal layer 240 covering the second semiconductor layers 253 completely, a height of the metal layer 240 being equal to a height of the second insulating layer 232.

The base 110 is provided and the photoresists 360 are removed. The base 110 includes a plurality of first electrodes 211, second electrodes 213 and insulating parts 212. Each insulating part 212 is located between the first electrode 211 and the second electrode 213. The structure showed in FIG. 8 (without photoresist 360) is revered and fixed on the base 110 via eutectic die bonding. The pre-growth layer 220 covers the first electrodes 211 and part of insulating parts 213. The second insulating layer 232 covers part of the insulating part 213. The metal layer 240 covers of the second electrodes 212 completely.

At last, the assistant base 380 and the colloid 390 are removed.

The embodiment shown and described above is only an example. Many details are often found in the art such as the other features of the grain. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A LED die, comprising:
   a substrate with a first electrode, a second electrode and an insulating part, the insulating part surrounding the first electrode and the second electrode surrounding the insulating part;
   a pre-growth layer formed on the first electrode;
   a light emitting structure formed on the pre-growth layer;
   a metal layer formed on the second electrode and surrounding the pre-growth layer; and
   an insulating layer formed between the pre-growth layer and the metal layer; the second electrode being electrically connected to the light emitting structure via the metal layer, and the first electrode being electrically connected to the light emitting structure via the pre-growth layer,
   wherein the insulating layer comprises a first insulating layer and a second insulating layer, and the first insulating layer is perpendicular to the second insulating layer,
   wherein the first insulating layer is horizontal and formed on the periphery edge of a top surface of the pre-growth layer with an opening defined on center of the top surface of the pre-growth layer, wherein the light emitting structure is a six-sided pyramid and comprises a first semiconductor layer, an active layer and a second semiconductor layer formed on the pre-growth layer in that order,
   wherein the first insulating layer is formed between the pre-growth layer and the active layer to prevent from directly direct electronic connection between the pre-growth layer and the active layer, and
   wherein the second insulating layer is formed between the pre-growth layer and the metal layer to prevent from directly direct electronic connection between the pre-growth layer and the metal layer.

2. The LED die of claim 1, wherein the second insulating layer is vertical and surrounds the pre-growth layer and the first insulating layer.

3. The LED die of claim 1, wherein the first semiconductor layer grows from the opening and further grows upwards to form a six-sided pyramid.

4. The LED die of claim 3, wherein a bottom surface of the active layer and a bottom surface of the second semiconductor layer are coplanar and attached on the insulating layer and the metal layer.

5. The LED die of claim 1, wherein the first semiconductor covers the pre-growth layer and the pre-growth layer covers the first electrode of the substrate, the first semiconductor is electronically connected to the first electrode of the substrate via the pre-growth layer.

6. The LED die of claim 1, wherein the second semiconductor covers the metal layer and the metal layer covers the second electrode of the substrate, the second semiconductor is electronically connected to the second electrode of the substrate via the metal layer.

* * * * *